(12) United States Patent
Patel et al.

(10) Patent No.: US 9,867,295 B2
(45) Date of Patent: Jan. 9, 2018

(54) BALL GRID ARRAY SYSTEM

(71) Applicant: Dell Products L.P., Round Rock, TX (US)

(72) Inventors: Bhavesh Patel, Austin, TX (US); Sandor Farkas, Round Rock, TX (US); Wallace Huson Ables, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 77 days.

(21) Appl. No.: 14/148,856

(22) Filed: Jan. 7, 2014

(65) Prior Publication Data

US 2015/0195910 A1 Jul. 9, 2015

(51) Int. Cl.
*H01L 21/66* (2006.01)
*H01L 23/00* (2006.01)
(Continued)

(52) U.S. Cl.
CPC ......... *H05K 3/3436* (2013.01); *B23K 1/0016* (2013.01); *B23K 1/20* (2013.01); *B23K 3/0623* (2013.01); *B23K 3/087* (2013.01); *G06F 1/181* (2013.01); *H01L 24/13* (2013.01); *H01L 24/14* (2013.01); *H01L 24/16* (2013.01); *H01L 24/17* (2013.01); *H01L 24/81* (2013.01); *H05K 1/145* (2013.01); *G01R 31/026* (2013.01); *G01R 31/048* (2013.01); *H01L 22/12* (2013.01); *H01L 22/14* (2013.01); *H01L 22/32* (2013.01); *H01L 22/34* (2013.01); *H01L 23/562* (2013.01); *H01L 2224/131* (2013.01); *H01L 2224/1319* (2013.01); *H01L 2224/13028* (2013.01); *H01L 2224/13582* (2013.01); *H01L 2224/13647* (2013.01);
(Continued)

(58) Field of Classification Search
CPC ... H01L 2224/0212; H01L 2224/81007; H01L 21/67242; H01L 22/14; H01L 22/30; H01L 22/34; H01L 22/12; H01L 23/562; H01L 2224/17517; H01L 2224/2612; H01L 22/32; G01R 31/048; G01R 31/026
See application file for complete search history.

(56) References Cited

U.S. PATENT DOCUMENTS 5,491,495 A * 2/1996 Ward .................. G06F 3/04883
345/163
6,151,406 A * 11/2000 Chang ...................... G06T 7/75
348/126

(Continued)

*Primary Examiner* — David Zarneke
(74) *Attorney, Agent, or Firm* — Haynes and Boone, LLP

(57) ABSTRACT

Systems and methods for providing a ball grid array connection include providing a circuit board having a circuit board surface including a plurality of pads. A ball grid array component includes a plurality of solder balls. The ball grid array component is coupled to the circuit board to position each of the plurality of solder balls adjacent a respective one of the plurality of pads. A solder reflow process is then performed to produce a plurality of soldered connections from each of the plurality of solder balls and a respective one of the plurality of pads. At least one spacer member is provided between the ball grid array component and the circuit board during the solder reflow process to provide a mechanical stop between the ball grid array component and the circuit board and a minimum height for each of the plurality of soldered connections.

8 Claims, 20 Drawing Sheets

(51) Int. Cl.
*G01R 31/02* (2006.01)
*G01R 31/04* (2006.01)
*H05K 3/34* (2006.01)
*G06F 1/18* (2006.01)
*B23K 1/00* (2006.01)
*B23K 1/20* (2006.01)
*B23K 3/06* (2006.01)
*B23K 3/08* (2006.01)
*H05K 1/14* (2006.01)

(52) U.S. Cl.
CPC ........... *H01L 2224/13655* (2013.01); *H01L 2224/14051* (2013.01); *H01L 2224/14131* (2013.01); *H01L 2224/14135* (2013.01); *H01L 2224/14136* (2013.01); *H01L 2224/14179* (2013.01); *H01L 2224/14505* (2013.01); *H01L 2224/14517* (2013.01); *H01L 2224/16106* (2013.01); *H01L 2224/16227* (2013.01); *H01L 2224/17051* (2013.01); *H01L 2224/17135* (2013.01); *H01L 2224/17136* (2013.01); *H01L 2224/17517* (2013.01); *H01L 2224/811* (2013.01); *H01L 2224/8121* (2013.01); *H01L 2224/8123* (2013.01); *H01L 2224/81139* (2013.01); *H01L 2224/81193* (2013.01); *H01L 2224/81815* (2013.01); *H01L 2224/81907* (2013.01); *H01L 2924/15311* (2013.01); *H01L 2924/19103* (2013.01); *H01L 2924/3512* (2013.01); *H05K 1/144* (2013.01); *H05K 2201/0221* (2013.01); *H05K 2201/10022* (2013.01); *H05K 2201/10734* (2013.01); *H05K 2203/041* (2013.01); *H05K 2203/159* (2013.01); *H05K 2203/162* (2013.01); *H05K 2203/163* (2013.01); *Y02P 70/613* (2015.11)

(56) References Cited

U.S. PATENT DOCUMENTS

| | | | | |
|---|---|---|---|---|
| 6,320,249 B1* | 11/2001 | Yoon | ............... | H01L 23/49827 174/250 |
| 6,339,254 B1* | 1/2002 | Venkateshwaran | . | H01L 25/0657 257/686 |
| 6,452,502 B1* | 9/2002 | Dishongh | .......... | G01R 31/2856 228/104 |
| 7,622,309 B2* | 11/2009 | Su | ........ | G01R 31/046 257/E21.521 |
| 7,876,566 B1* | 1/2011 | Frisch | ..................... | G06F 1/185 165/185 |
| 9,646,954 B2* | 5/2017 | Liang | ...................... | H01L 22/34 |
| 2002/0074159 A1* | 6/2002 | Gallup | ................... | H05K 3/303 174/260 |
| 2003/0194353 A1* | 10/2003 | Gilbert | ................. | B01L 3/0244 422/520 |
| 2005/0077080 A1* | 4/2005 | Dairo | ..................... | H05K 3/303 174/255 |
| 2005/0112842 A1* | 5/2005 | Kang | .................. | H01L 23/3128 438/455 |
| 2007/0080704 A1* | 4/2007 | Park | ........................ | G01R 31/2853 324/762.02 |
| 2007/0252612 A1* | 11/2007 | Sylvester | ............. | G01R 31/048 324/762.02 |
| 2007/0296068 A1* | 12/2007 | Schnetker | .............. | H05K 1/0268 257/669 |
| 2008/0068795 A1* | 3/2008 | Pav | .......................... | G06F 1/20 361/695 |
| 2008/0093535 A1* | 4/2008 | O'Neal | .................. | G06F 1/1616 250/221 |
| 2008/0106868 A1* | 5/2008 | Hoss | .................... | H01L 23/367 361/704 |
| 2008/0218988 A1* | 9/2008 | Burns | ................... | H05K 1/023 361/811 |
| 2012/0001642 A1* | 1/2012 | Sylvester | ............. | G01R 31/048 324/538 |
| 2012/0286418 A1* | 11/2012 | Lee | ................... | H01L 23/49811 257/737 |
| 2014/0175661 A1* | 6/2014 | Kim | ....................... | H01L 24/17 257/773 |
| 2015/0049450 A1* | 2/2015 | Okamoto | .......... | H01L 23/49816 361/779 |
| 2015/0228550 A1* | 8/2015 | Yu | ....................... | H01L 25/0652 257/48 |
| 2015/0241504 A1* | 8/2015 | Mutnury | .............. | G01R 31/048 324/538 |

* cited by examiner

BALL GRID ARRAY SYSTEM

CROSS-REFERENCE TO RELATED APPLICATIONS

This is application is related to U.S. Utility application Ser. No. 14/190,850, filed Feb. 26, 2014, the disclosure of which is incorporated herein by reference in its entirety.

BACKGROUND

The present disclosure relates generally to information handling systems, and more particularly to a ball grid array system for connecting information handling system components to an information handling system.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Some IHS components utilize ball grid arrays for coupling to IHSs. Ball grid arrays are a type of surface-mount packaging that may, for example, be used to permanently mount integrated circuits such as processors to a circuit board, and are widely used due to their high connection density and signal integrity performance. However, ball grid arrays may be subject to mechanical stresses that can degrade or even break the soldered connection(s) between the processor and the pads on the circuit board. For example, ball grid arrays may provide solder balls arranged in a square or rectangle, and forces on the processor or other portion of the ball grid array after soldering may result in high stresses on the soldered connections at the corners of the ball grid array that damage or degrade those soldered connections. Conventional solutions to this problem are to provide larger pads for the soldered connections at the corners, and/or provide sacrificial soldered connections at the corners of the ball grid array. However, it is also desirable to use ball grid arrays for board-to-board connections. Such board-to-board connections are typically subject to higher mechanical forces and require relatively larger ball grid arrays. In addition, board-to-board connections can also introduce unevenly distributed weights on the ball grid array (e.g., due to components located on the board) relative to a ball grid array provided for a processor, which can cause problems related to keeping the boards parallel and ensuring that the solder balls do not introduce a short across the pads during soldering (or more accurately, a solder reflow process). The relatively larger ball grid arrays can also cause problems with regard to detecting open or shorted soldered connections using standard optical inspection, and sometimes require X-ray inspection which raises costs.

Accordingly, it would be desirable to provide an improved ball grid array system.

SUMMARY

According to one embodiment, a method for providing a ball grid array connection includes providing a circuit board having a circuit board surface including a plurality of pads; coupling a ball grid array component to the circuit board, wherein the ball grid array component includes a plurality of solder balls, and wherein the coupling positions each of the plurality of solder balls adjacent a respective one of the plurality of pads; performing a solder reflow process on the coupled circuit board and ball grid array component, wherein the solder reflow process produces a plurality of soldered connections from each of the plurality of solder balls and a respective one of the plurality of pads; and providing at least one spacer member between the ball grid array component and the circuit board during the solder reflow process, wherein the at least one spacer member provides a mechanical stop between the ball grid array component and the circuit board and a minimum height for each of the plurality of soldered connections.

BRIEF DESCRIPTION OF THE DRAWINGS

FIG. 2b is a top view illustrating an embodiment of the ball grid array component of FIG. 2a.

FIG. 2c is a longitudinal cross sectional side view illustrating the embodiment of the ball grid array component of FIG. 2a.

FIG. 2d is a transverse cross sectional side view illustrating the embodiment of the ball grid array component of FIG. 2a.

FIG. 3b is a top view illustrating an embodiment of the circuit board of FIG. 3a.

FIG. 3c is a longitudinal cross sectional side view illustrating the embodiment of the circuit board of FIG. 3a.

FIG. 3d is a transverse cross sectional side view illustrating the embodiment of the circuit board of FIG. 3a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
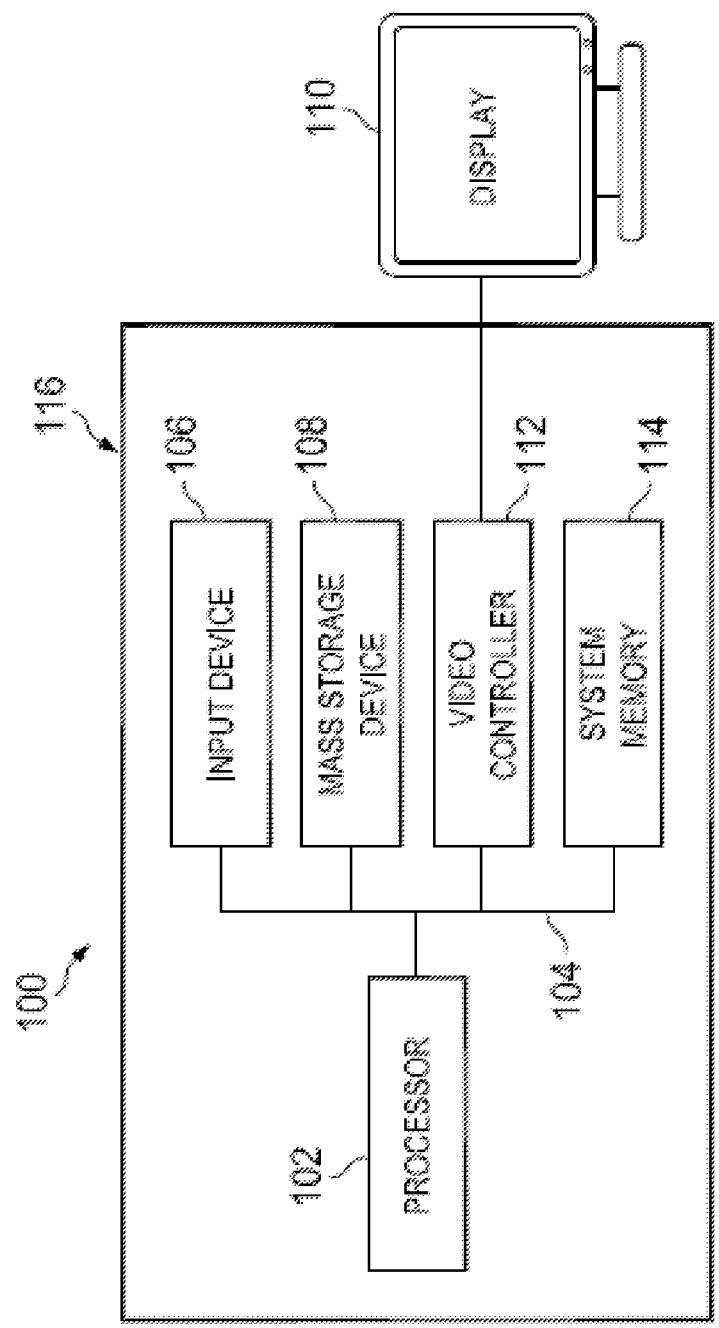
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Referring now to FIGS. 2a, 2b, 2c, and 2d, an embodiment of a ball grid array component 200 is illustrated. While the systems and method discussed below are directed to the connecting of the ball grid array component 200 to a circuit board using soldering techniques, one of skill in the art in possession of the present disclosure will recognize that the teachings herein will benefit a wide variety of other components and connection techniques and thus will fall within its scope. The ball grid array component 200 includes a base 202 having a top surface 202a, a bottom surface 202b located opposite the base 202 from the top surface 202a, a front edge 202c extending between the top surface 202a and the bottom surface 202b, a rear edge 202d located opposite the base 202 from the front edge 202c and extending between the top surface 202a and the bottom surface 202b, and a pair of opposing side edges 202e and 202f that are located opposite the base 202 from each other and that each extend between the top surface 202a, the bottom surface 202b, the front edge 202c, and the rear edge 202d. In the illustrated embodiment, a ball grid array device 204 is located on the top surface 202a of the base 202. In some examples, the ball grid array component 200 may be an integrated circuit component, and the ball grid array device 204 is a processor (e.g., the processor 102 discussed above with reference to FIG. 1). In other examples, the ball grid array component 200 may be a circuit board component, and the ball grid array device 204 may be circuit board components such as, for example, cabling and/or other circuit board components known in the art that may be included in the IHS 100 discussed above with reference to FIG. 1. While a few examples have been provided, the ball grid array component may be any component, device, and/or other IHS system that uses a ball grid array for connection to the IHS (e.g., the IHS 100 discussed above with reference to FIG. 1).

Figure 2A:
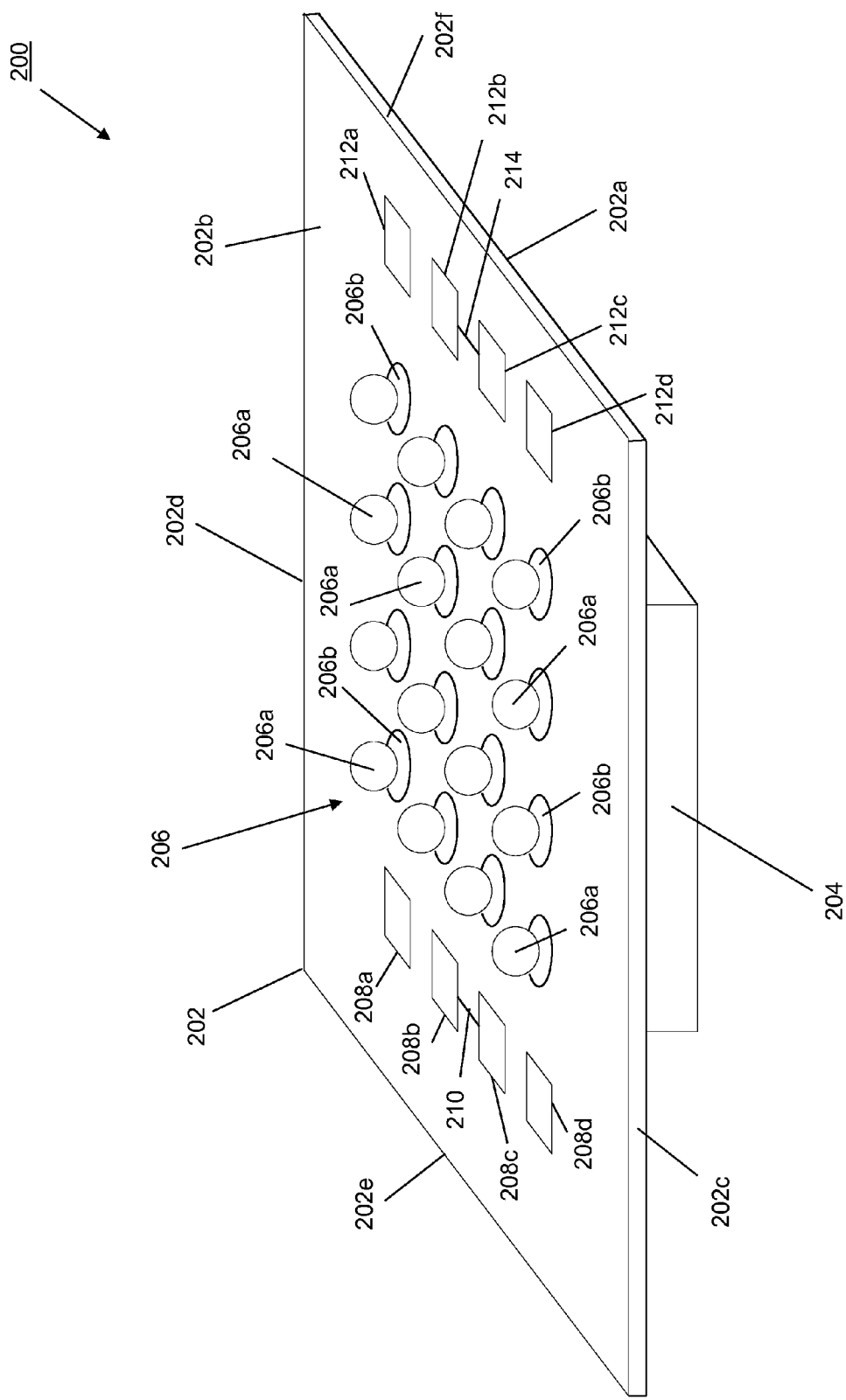
FIG. 2a is a perspective view illustrating an embodiment of a ball grid array component.
Figure 2B:
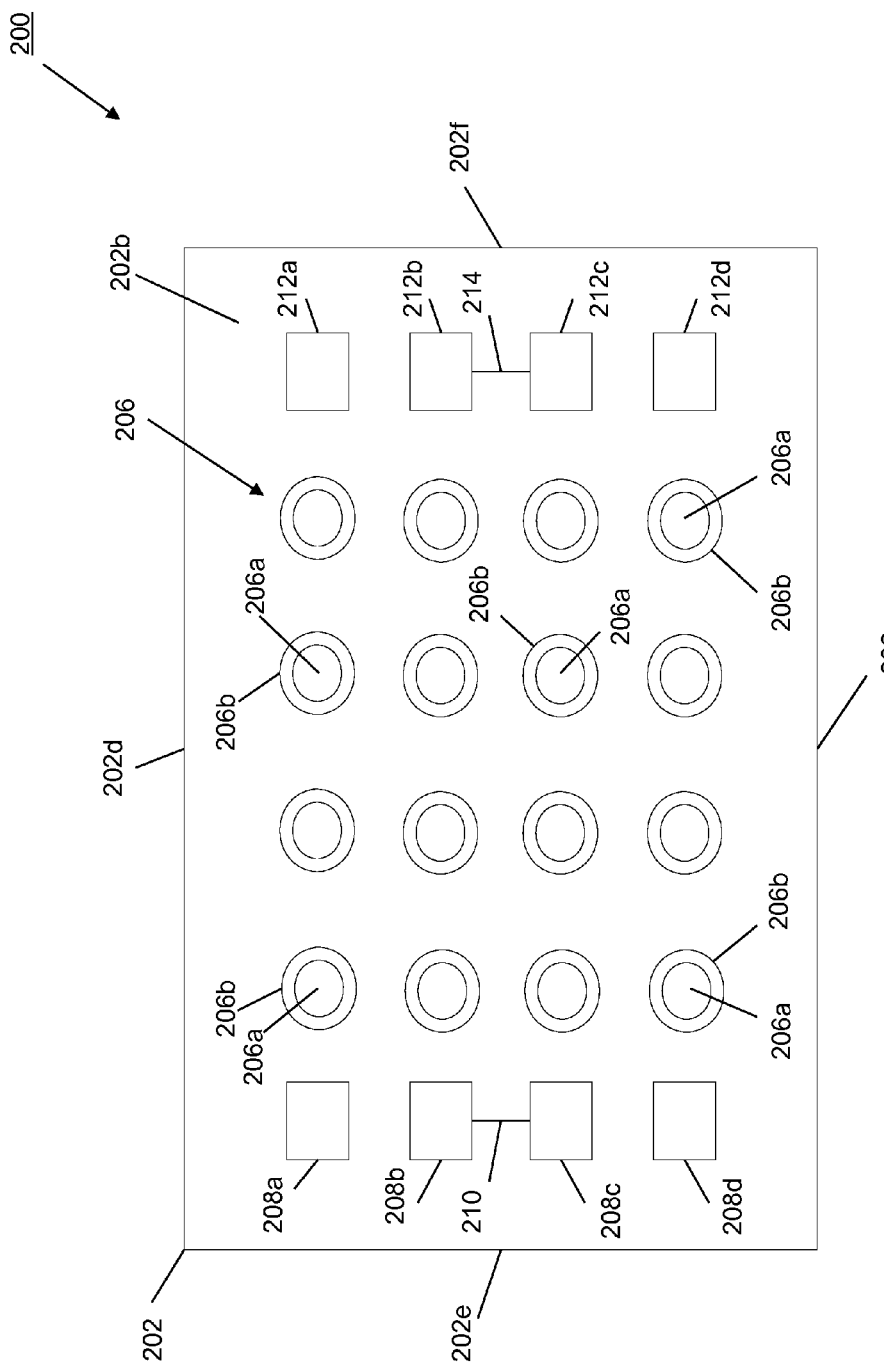
Figure 2C:
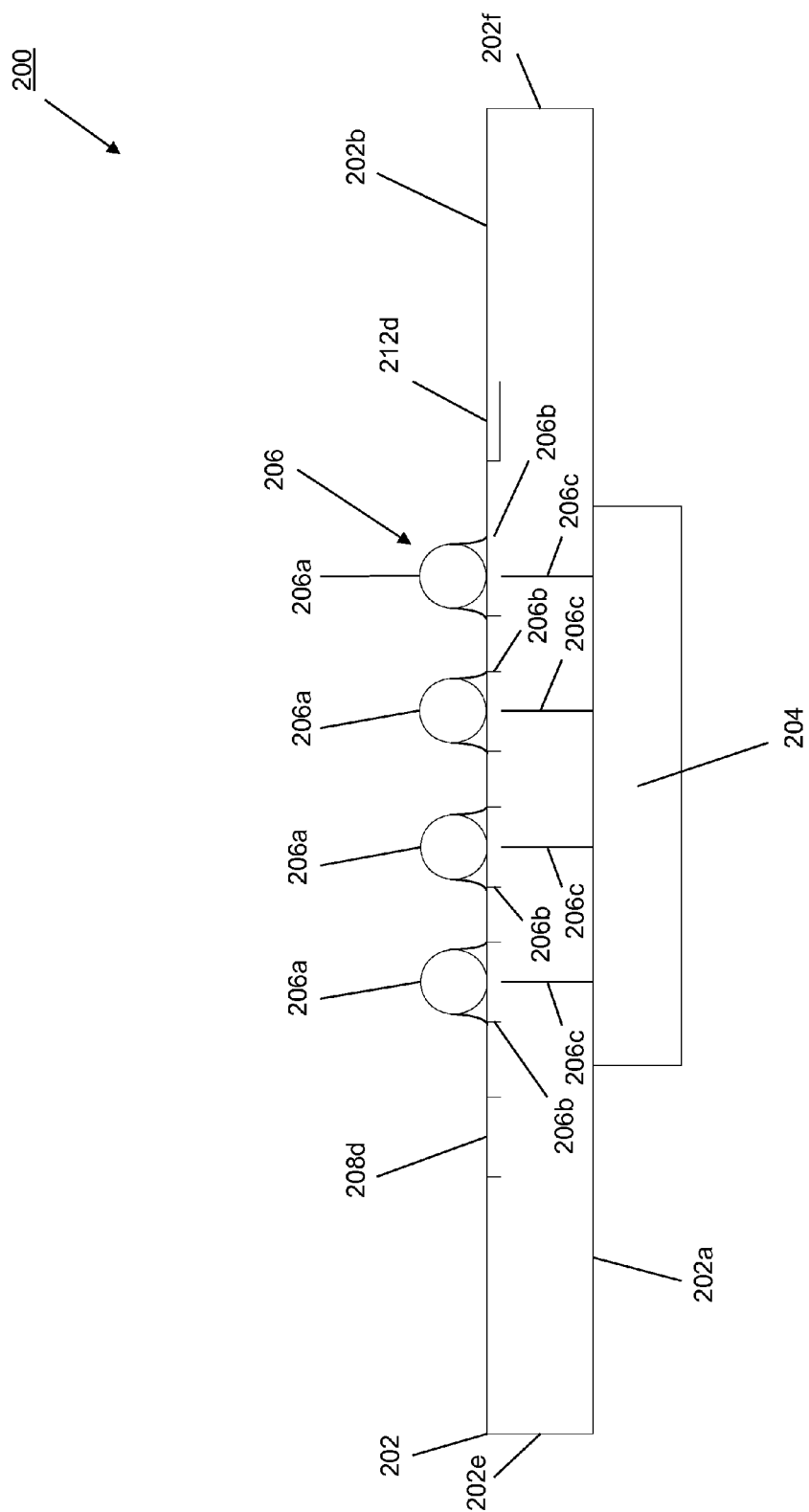
Figure 2D:
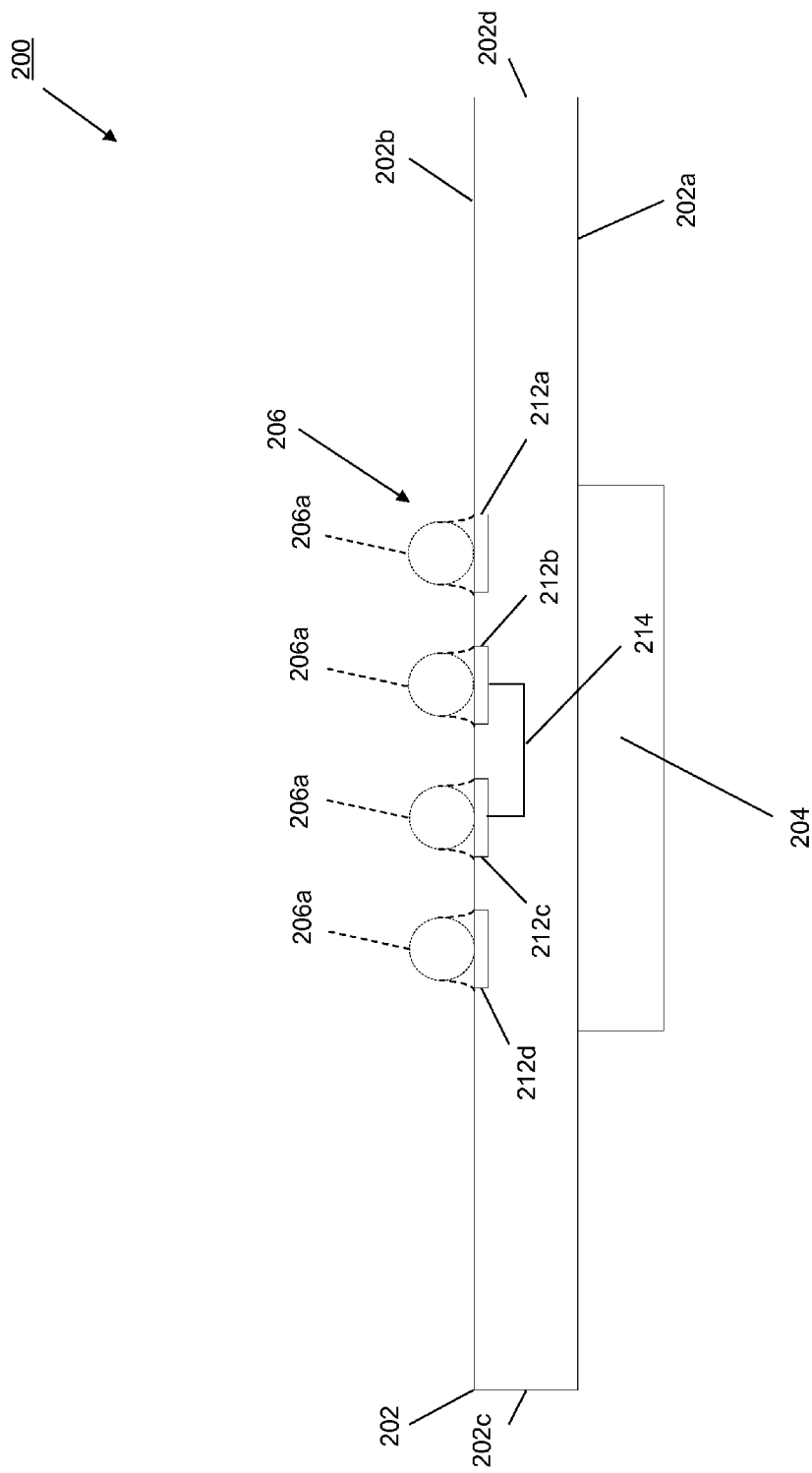
Figure 3A:
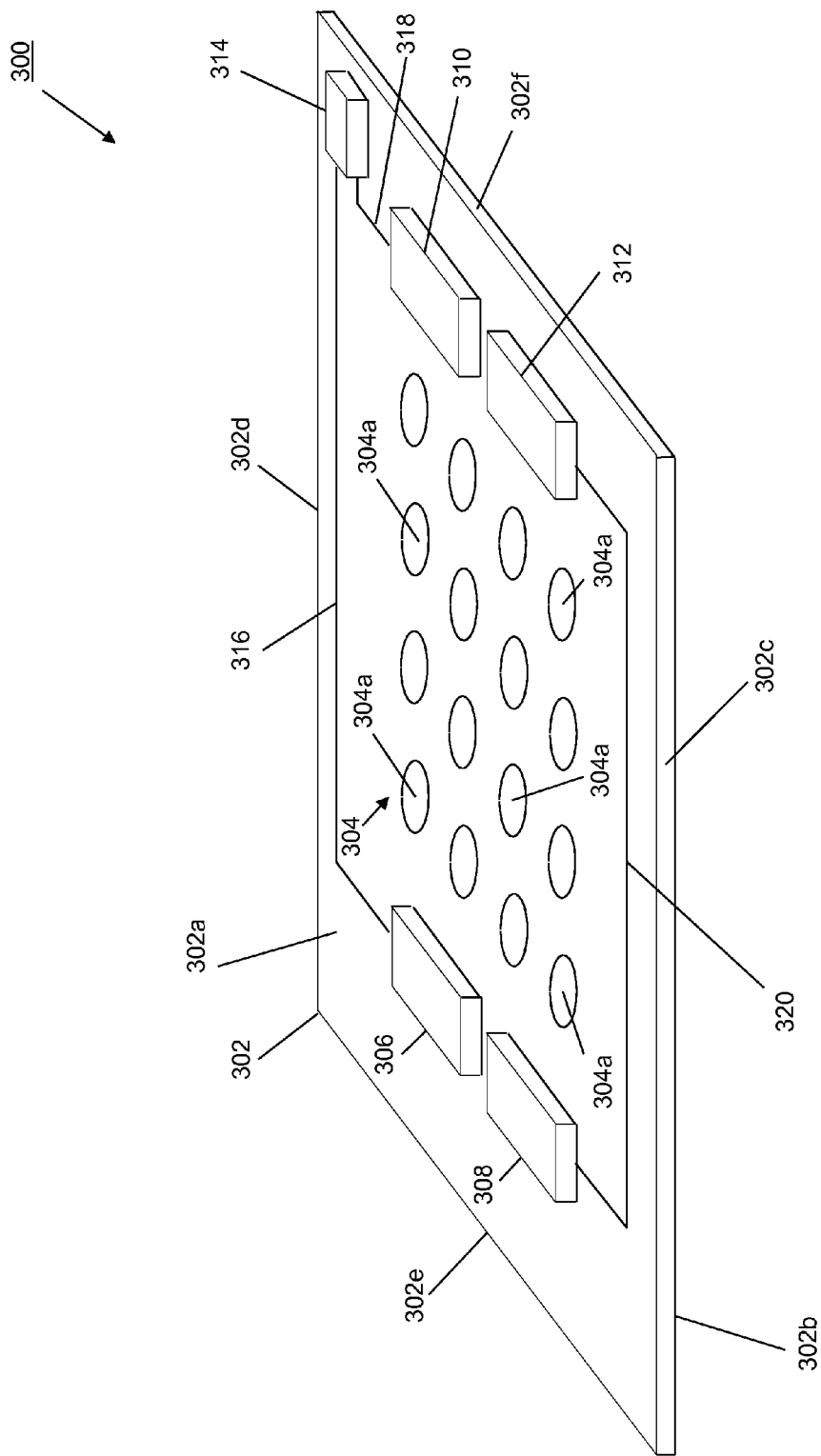
FIG. 3a is a perspective view illustrating an embodiment of a circuit board.
Figure 3B:
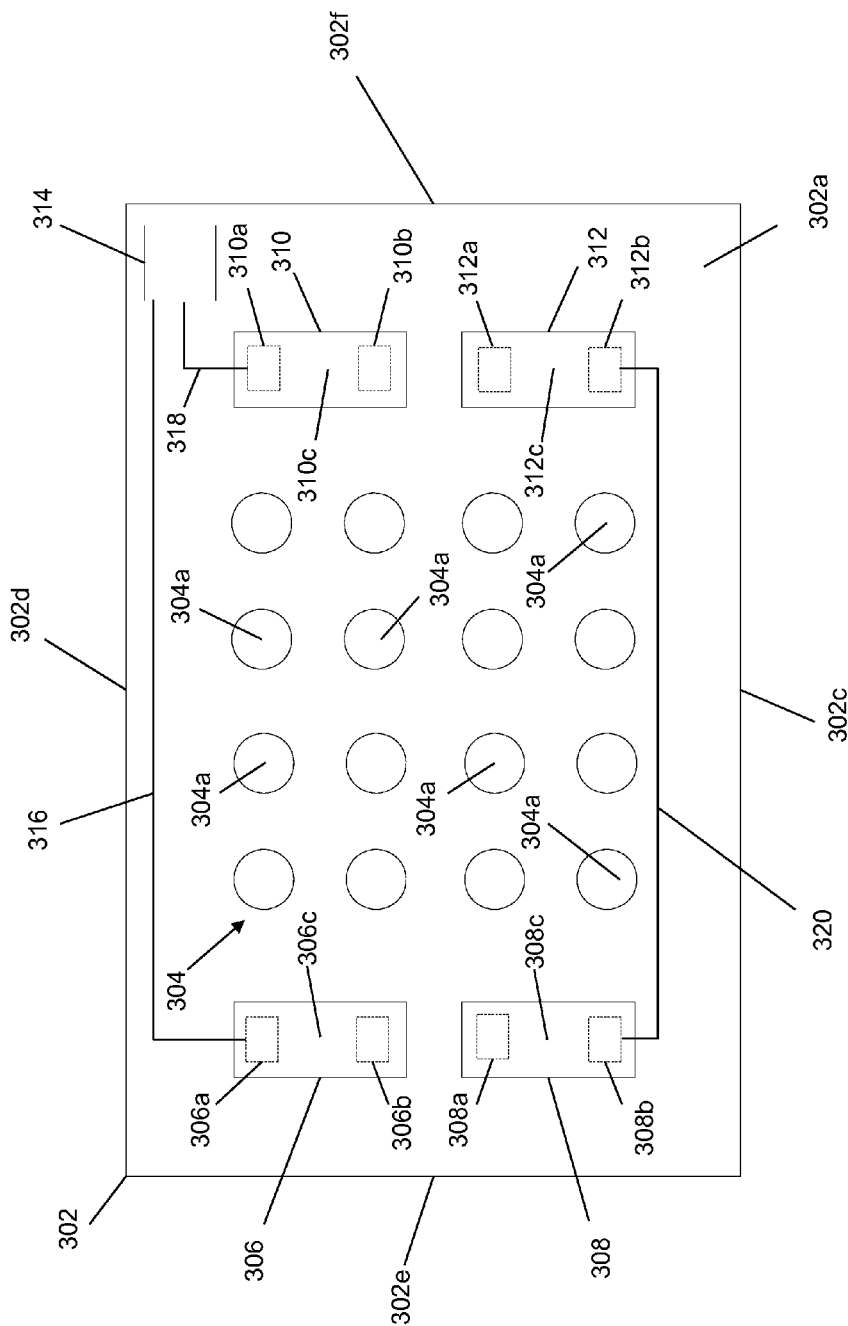
Figure 3C:
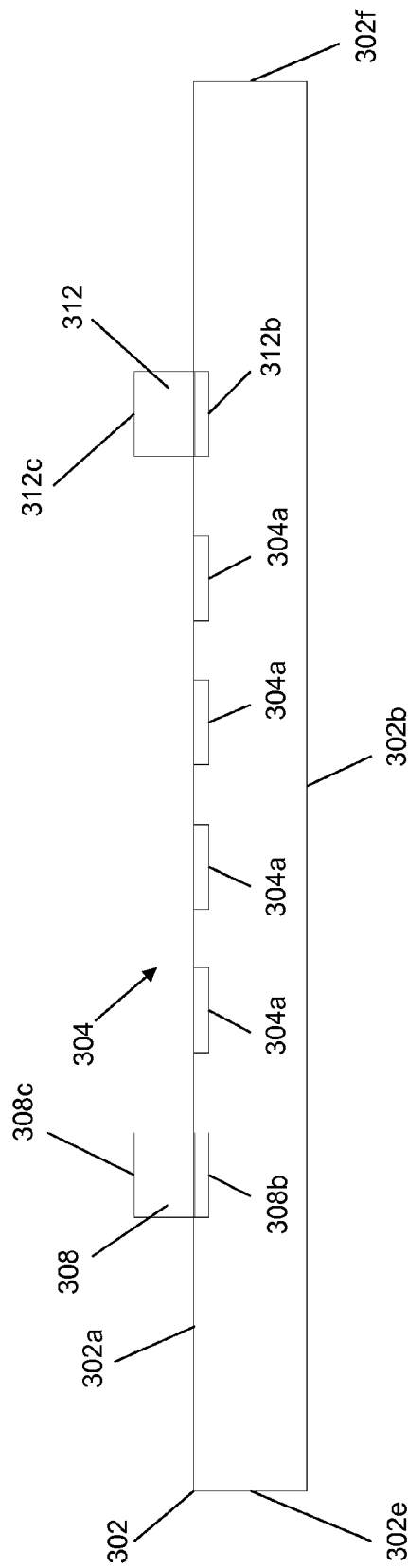
Figure 3D:
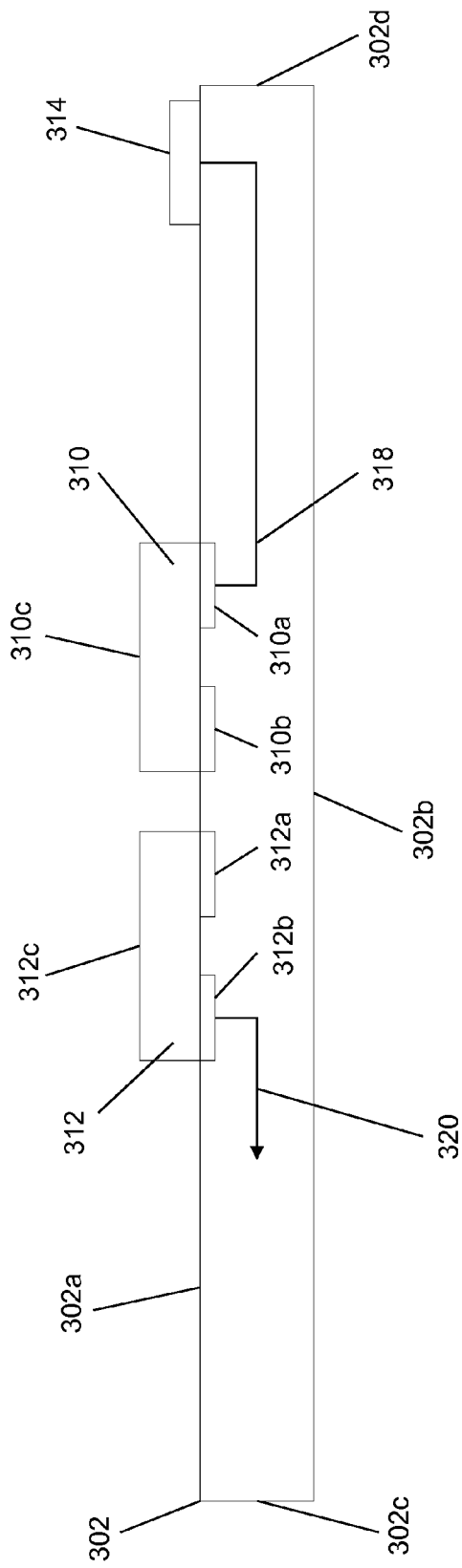

The ball grid array component 200 includes a solder ball array 206 located on the bottom surface 202b of the base 202. The solder ball array 206 includes a plurality of solder balls 206a provided on respective solder ball connections 206b that may be electrically connected through the base 202 via connections 206c to the ball grid array device 204 and/or other devices in or on the base 202. While the solder ball array 206 is illustrated as a square-shaped array, one of skill in the art will recognize that the solder ball array 206 may take any of a variety of shapes (e.g., integrated circuit ball grid array components typically include a "hollow rectangular" solder ball array) while remaining within the scope of the present disclosure. A plurality of second spacer member connections 208a, 208b, 208c, and 208d are provided on the bottom surface 202b of the base 202 between the solder ball array 206 and the side edge 202e, with the second spacer member connections 208b and 208c electrically coupled together by a trace 210. A plurality of first spacer member connections 212a, 212b, 212c, and 212d are provided on the bottom surface 202b of the base 202 between the solder ball array 206 and the side edge 202f, with the first spacer member connections 212b and 212c electrically coupled together by a trace 214. FIG. 2d illustrates a side view of the ball grid array component 200 that illustrates the first spacer member connections 212a-d, with the solder balls 206a illustrated with dashed lines to indicate their position on the bottom surface 202b spaced apart from the first spacer member connections 212a-d. As discussed below, in some embodiments, the spacer member connectors may be omitted. Furthermore, in embodiments that include the spacer member connectors, those spacer member connectors may include any configuration necessary to allow for the completion of a ball grid array monitoring circuit with spacer member on the circuit board, discussed in further detail below.

Referring now to FIGS. 3a, 3b, 3c, and 3d, an embodiment of a circuit board 300 is illustrated. As discussed above, while the systems and method discussed below are directed to the connecting of the ball grid array component 200 to the circuit board 300 using soldering techniques, one of skill in the art in possession of the present disclosure will recognize that the teachings herein will benefit a wide variety of other component and connection techniques and thus will fall within its scope. The circuit board 300 includes a base 302 having a top surface 302a, a bottom surface 302b located opposite the base 302 from the top surface 302a, a front edge 302c extending between the top surface 302a and the bottom surface 302b, a rear edge 302d located opposite the base 302 from the front edge 302c and extending between the top surface 302a and the bottom surface 302b, and a pair of opposing side edges 302e and 302f that are located opposite the base 302 from each other and that each extend between the top surface 302a, the bottom surface 302b, the front edge 302c, and the rear edge 302d.

The circuit board 300 includes a pad array 304 located on the top surface 302a of the base 302. The pad array 304 includes a plurality of pads 304a that may be electrically connected through the base 302 to any variety of devices located on the base 302 or otherwise coupled to the circuit board 300. While the pad array 304 is illustrated as a square-shaped array, one of skill in the art will recognize that the pad array may take any of a variety of shapes (e.g., integrated circuit pad arrays typically include a "hollow rectangular" pad array) while remaining within the scope of the present disclosure. A plurality of first spacer members 306 and 308 are provided on the top surface 302a of the base 302 between the pad array 304 and the side edge 302e, and plurality of second spacer members 310 and 312 are provided on the top surface 302a of the base 302 between the pad array 304 and the side edge 302f. In the embodiments discussed below, the spacer members 306, 308, 310, and 312 are conductive devices such as, for example, Surface Mount Technology (SMT) resistors. However, in other embodiments, the spacer members may not be conductive and may simply provide a mechanical stop during a solder reflow process that results in a minimum height for any soldered connections, discussed in further detail below.

In the illustrated embodiment the spacer members 306, 308, 310, and 312 are SMT resistors, with the spacer member 306 coupled (e.g., soldered) to connectors 306a and 306b on the base 302, the spacer member 308 coupled (e.g., soldered) to connectors 308a and 308b on the base 302, the spacer member 310 coupled (e.g., soldered) to connectors 310a and 310b on the base 302, and the spacer member 312 coupled (e.g., soldered) to connectors 312a and 312b on the base 302. The spacer members 306, 308, 310, and 312 may also include one or more conductive portions on their top surfaces 306c, 308c, 310c, and 312c, respectively, discussed in further detail blow. A ball grid array monitoring engine 314 may be located on the top surface 302a of the base 302, and is coupled to the first spacer member 306 by a trace 316 connected to the connector 306a and to the second spacer member 310 by a trace 318 connector to the connector 310a. In addition, the first spacer member 308 is coupled to the second spacer member 312 by a trace 320 connected to the connectors 308b and 312b.

The ball grid array monitoring engine 314 may be provided by instructions that are located on a memory system (e.g., the memory 114 discussed above with reference to FIG. 1) and that, when executed by a processing system (e.g., the processor 102 discussed above with reference to FIG. 1), cause the processing system to perform the functions of the ball grid array monitoring engine discussed below. The ball grid array monitoring engine 314 is illustrated as being located on the top surface 302a of the base 302 for clarity of illustration and discussion. However, the ball grid array monitoring engine may be provided by a processing system (and memory system) that are located in an IHS and coupled to the traces 316 and 318. For example, the ball grid array monitoring engine 314 may be provided by a Basic Input Output System (BIOS) in an IHS. While a specific configuration of spacer members has been illustrated, the spacer members may be provided in any configuration that provides for a mechanical stop during a solder reflow process that results in a minimum height for any soldered connections, discussed in further detail below, as well as to provide structural support for the component/board assembly. Furthermore, when the spacer members are provided as conductive spacer members, those conductive spacer members may be coupled together in any manner to provide a portion of a conductive circuit that may be completed as a result of the solder reflow process discussed below, such that the conductive spacer members enable the monitoring of the ball grid array soldered connections discussed below.

Figure 4:
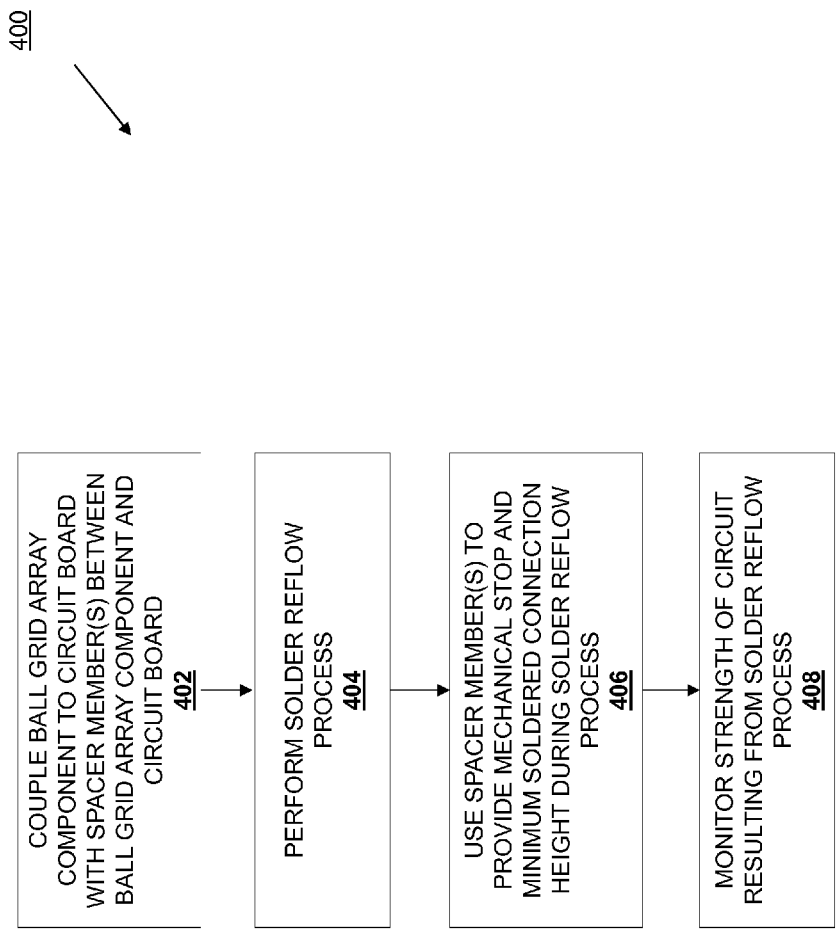
FIG. 4 is a flow chart illustrating an embodiment of a method for providing a ball grid array connection.
Figure 5A:
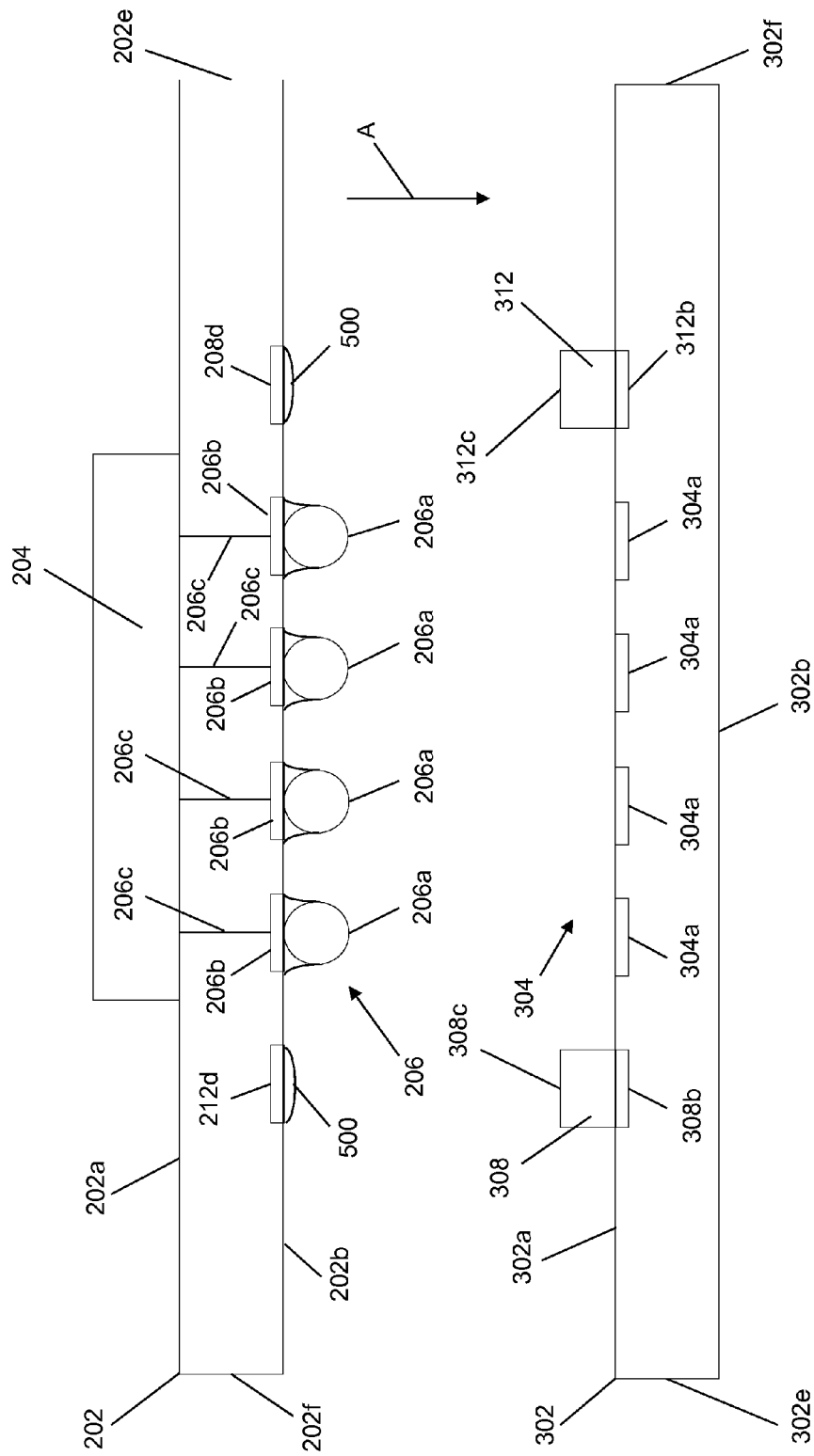
FIG. 5a is a longitudinal cross sectional side view illustrating the coupling of the ball grid array component of FIGS. 2a-2d to the circuit board of FIGS. 3a-3d.
Figure 5B:
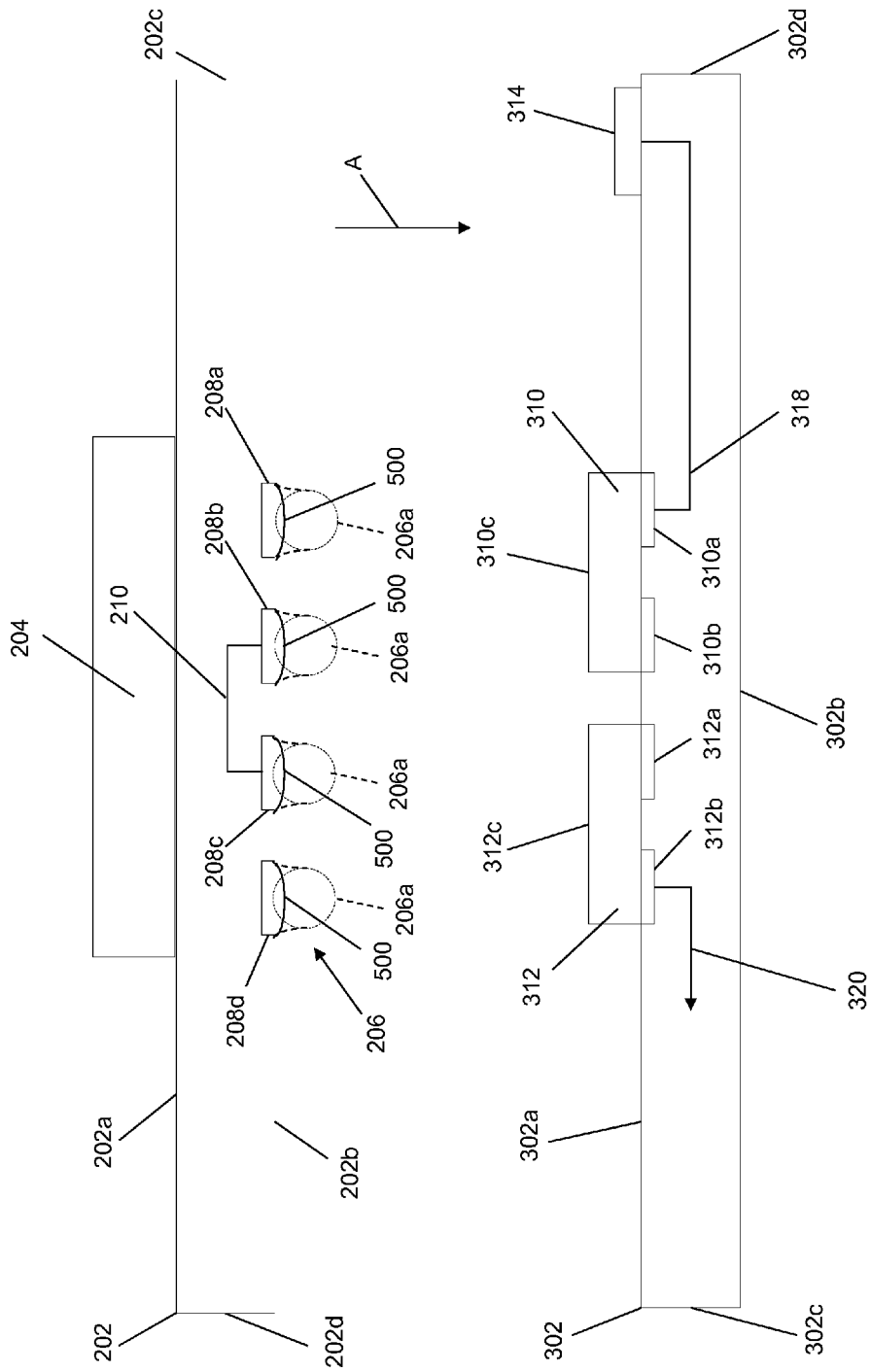
FIG. 5b is a transverse cross sectional side view illustrating the coupling of the ball grid array component of FIGS. 2a-2d to the circuit board of FIGS. 3a-3d.

Referring now to FIGS. 4, 5a, and 5b, an embodiment of a method 400 for providing a ball grid array connection is illustrated. Similarly as discussed above, while the method 400 focuses on connecting the ball grid array component 200 to the circuit board 300 using a solder reflow process, one of skill in the art in possession of the present disclosure will recognize how the method 400 may be applied to a variety of other components and connection techniques while remaining within the scope of the present disclosure. The method 400 begins at block 402 where the ball grid array component is coupled to the circuit board. FIGS. 5a and 5b illustrate how the ball grid array component 200 may be positioned over the circuit board 300 such that the bottom surface 202b of the base 202 on the ball grid array component 200 is facing the top surface 302 on the base 302 of the circuit board 300, with the solder ball array 206 aligned with the pad array 304 such that each solder ball 206a is aligned with a respective pad 304a. In some embodiments, alignment features (not illustrated) may be provided on the ball grid array component 200, the circuit board 300, and/or a solder reflow process device (not illustrated) in order to align the solder ball array 206 with the pad array 304. Solder paste 500 (e.g., a semi-adhesive mixture of powered solder and flux) may be provided on each of the second spacer member connections 208a-d and the first spacer member connections 212a-d prior to positioning the ball grid array component 200 over the circuit board 300. While not illustrated, solder paste may also be provided on each of the pads 304a in the pad array 304.

The ball grid array component 200 is then moved relative to the circuit board 300 in a direction A until the solder ball array 206 engages the pad array 304 such that each of the solder balls 206a engage (or are located immediately adjacent) a respective pad 304a in the pad array 304, the first spacer member connections 212a-b are located adjacent the first spacer member 306, the first spacer member connections 212c-d are located adjacent the first spacer member 308, the second spacer member connections 208a-b are located adjacent the second spacer member 310, and the second spacer member connections 208c-d are located adjacent the second spacer member 312. Initially (i.e., prior to the solder reflow process described below), the height of the solder balls 206a in the solder ball array 206 (e.g., measured from the bottom surface 202b of the base 202 of the ball grid array component 200 to the distal ends of the solder balls 206a) is greater than the height of the spacer members 306, 308, 310, and 312 (e.g., measured from the top surface 302a of the base 302 of the circuit board 300 to the top surfaces 306c, 308c, 310c, and 312c of the spacer members 306, 308, 310, and 312, respectively).

The method 400 then proceeds to block 404 where a solder reflow process is performed. In an embodiment, the solder reflow process may include the process of using the solder paste 500 to temporarily attached the ball grid array component 200 to the circuit board 300, after which the component/board assembly is subjected to a controlled heat that melts the solder balls 206a and permanently connects the ball grid array component 200 to the circuit board 300. The solder reflow process performed at block 404 may include passing the component/board assembly through a reflow oven or under an infrared lamp, conducting preheat, thermal soak, reflow, and/or cooling steps, and/or performing a variety of other solder reflow process actions known in the art. In some embodiments, the weight of the ball grid array component 200 may be sufficient to hold the ball grid array component 200 in place on the circuit board 300 (e.g., such that the ball grid array component 200 does not move relative to the circuit board 300 during the solder reflow process) and/or ensure that the solder paste 500 does not shift during the solder reflow process. In some embodiments, weight may be added to the ball grid array component 200 to hold the ball grid array component 200 in place on the circuit board 300 and/or to ensure that the solder paste 500 does not shift during the solder reflow process. In some embodiments, clamps or other devices may be used to engage the ball grid array component 200 and the circuit board 300 to hold the ball grid array component 200 in place on the circuit board 300 and/or to ensure that the solder paste 500 does not shift during the solder reflow process.

Figure 5C:
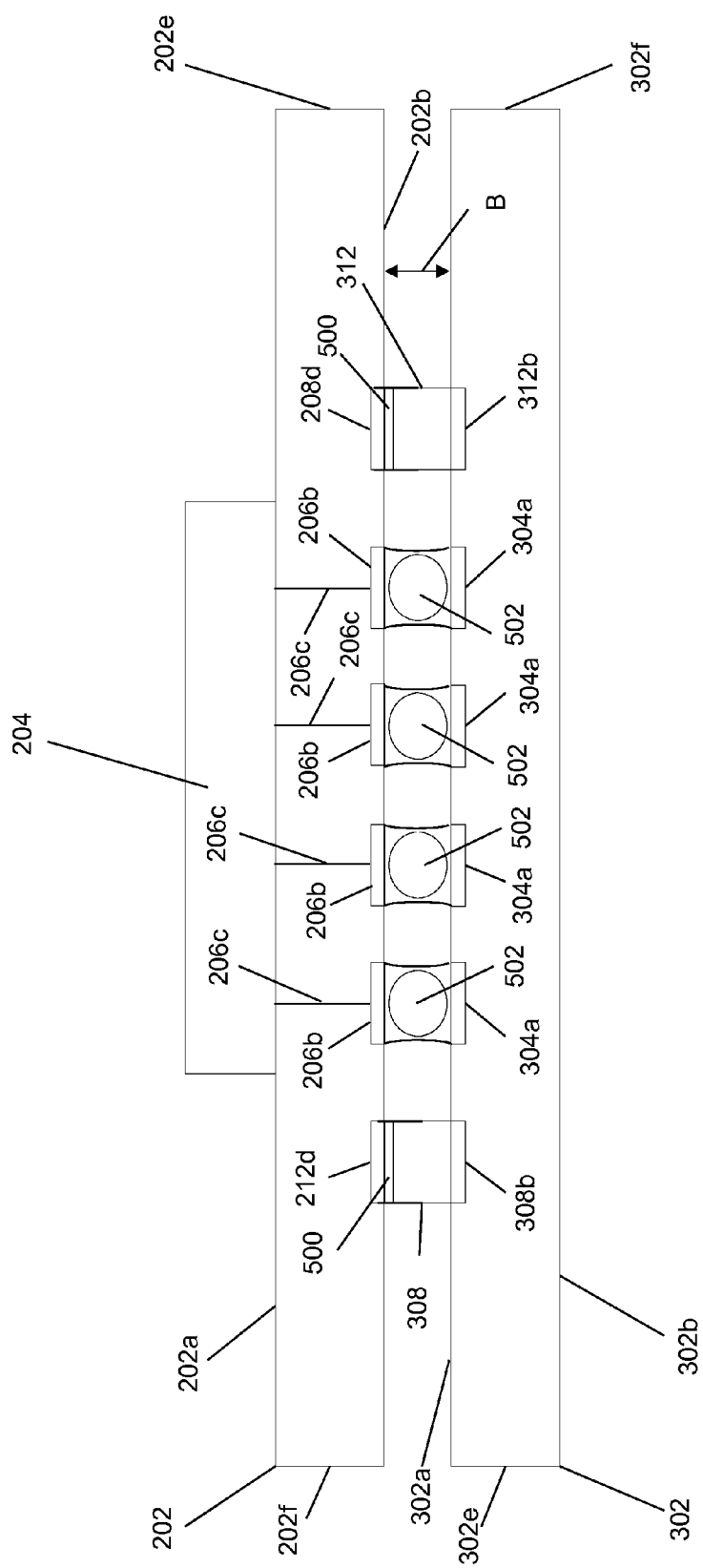
FIG. 5c is a longitudinal cross sectional side view illustrating the ball grid array component of FIGS. 2a-2d to properly soldered to the circuit board of FIGS. 3a-3d.

Referring now to FIGS. 4, 5c, 5d, and 5e, the method 400 then proceeds to block 406 where spacer member(s) are used to provide a mechanical stop and minimum solder connection height during the solder reflow process. While illustrated as separate method blocks, one of skill in the art in possession of the present disclosure will recognize the performance of blocks 406 occurs during the performance of the solder reflow process of block 404. During the solder reflow process, each of the solder balls 206a in the solder ball array 206 partially collapse and fuse with solder paste on respective pads 304a in the pad array 304 to provide a plurality of soldered connections 502 in a soldered connection array, as illustrated in FIG. 5c. However, during the solder reflow process, the first spacer members 306 and 308 and the second spacer members 310 and 312 provide a mechanical stop between the circuit board 300 and the ball grid array component 200 that prevents the bottom surface 202b of the base 202 on the ball grid array component 200 from being repositioned (due to the collapse of the solder balls 206a) to less than a minimum distance from the top surface 302a on the base 302 of the circuit board 300, which results in the provision of a minimum height B of each of the plurality of soldered connections 502 that is substantially equal to the height of the first spacer members 306 and 308 and the second spacer members 310 and 312. In an embodiment, a weight on the ball grid array component 200, or a clamp engaging the ball grid array component 200 and the circuit board 300, may ensure that the base 202 on the ball grid array component 200 engages all of the spacer members 306, 308, 310, and 312, and the base 202 on the ball grid array component 200 remains parallel to the base 302 on the circuit board 300.

The use of spacer members such as the first spacer members 306 and 308 and the second spacer members 310 and 312 of the illustrated embodiment has been found to be particularly beneficial in systems that provide a weight on the ball grid array component 200 (or clamp the ball grid array component 200 to the circuit board 300), as such systems have the ability to collapse the solder balls/soldered connections during the solder reflow process, which can cause shorting across soldered connections and pads. For example, weights or clamps may be used when devices (e.g., cabling) on the ball grid array component 200 prevent the ball grid array component from freely "floating" on the circuit board 300 (i.e., with each of solder balls engaging a respective pad), and without the systems and methods described herein, problems with the soldered connections may arise. In addition, when the spacer members are soldered to the circuit board 300 as well as to the ball grid array component 200 (e.g., by the solder paste 500 during the solder reflow process), the spacer members provide mechanical strength to the component/board assembly.

Figure 5D:
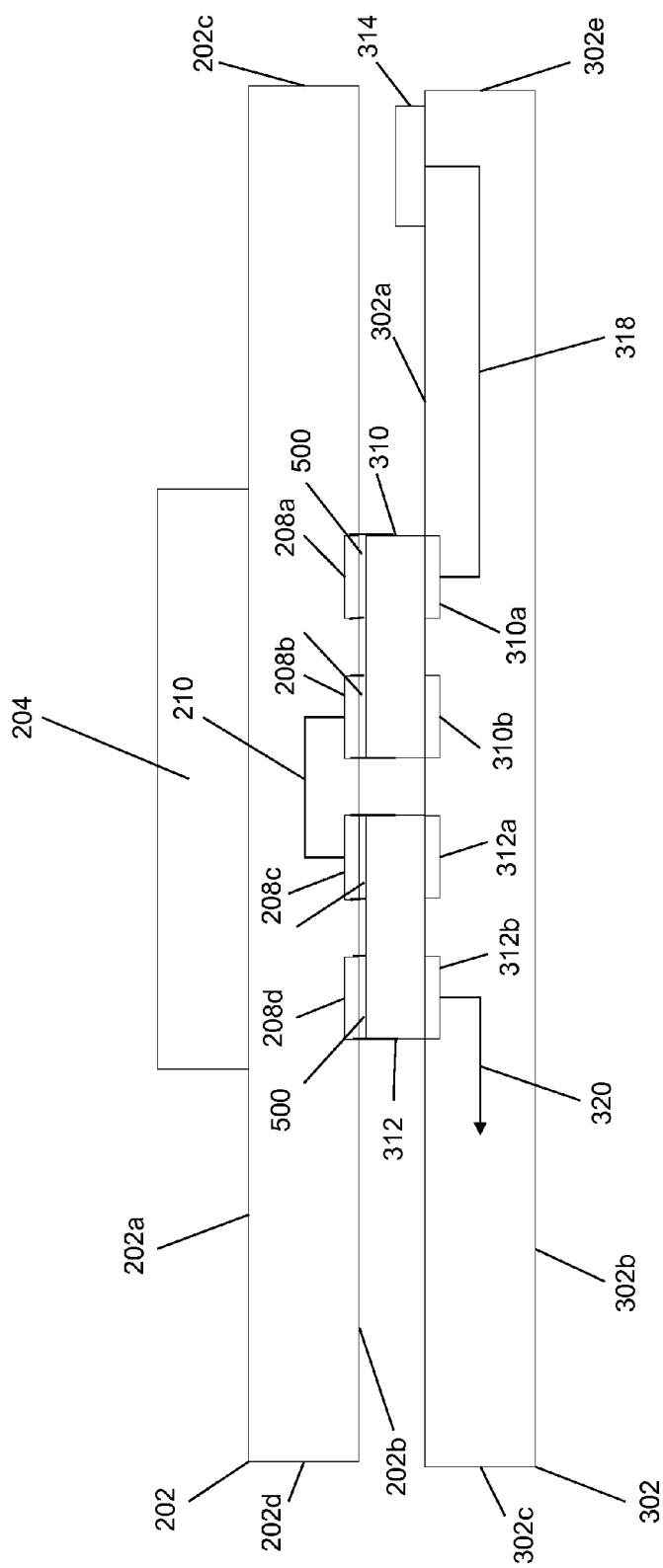
FIG. 5d is a transverse cross sectional side view illustrating the ball grid array component of FIGS. 2a-2d to properly soldered to the circuit board of FIGS. 3a-3d.
Figure 5E:
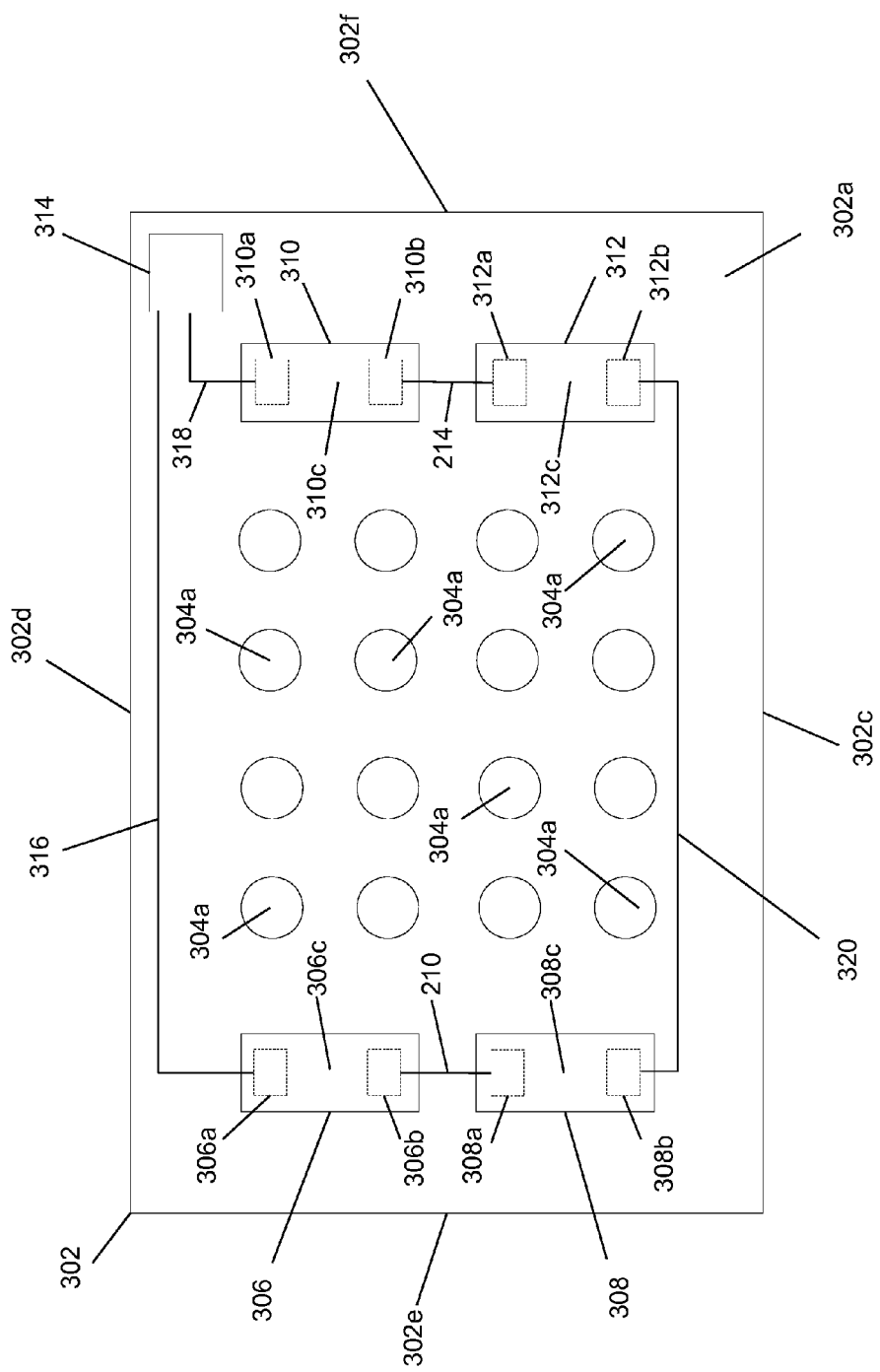
FIG. 5e is a top view illustrating the ball grid array component of FIGS. 2a-2d to properly soldered to the circuit board of FIGS. 3a-3d.

Referring now to FIGS. 4, 5d, 5e, the method 400 may proceed to block 408 where the strength of a circuit created during the solder reflow process is monitored. In embodiments where the first spacer members 306 and 308 and the second spacer members 310 and 312 are conductive members, the solder reflow process creates a ball grid array monitoring circuit between the ball grid array component 200 and the circuit board 300. As can be seen from FIGS. 5b and 5d, the solder reflow process solders (via the solder paste 500) the conductive portions on the top surface 310c of the second spacer member 310 to the second spacer member connections 208a and 208b, and the conductive portions on the top surface 312c of the second spacer member 312 to the second spacer member connections 208c and 208d. Similarly as discussed above with reference to FIG. 2d, FIG. 5b illustrates a side view of the ball grid array component 200 that illustrates the second spacer member connections 208a-d, with the solder balls 206a illustrated with dashed lines to indicate their position on the bottom surface 202b spaced apart from the second spacer member connections 208a-d. Similarly, the solder reflow process solders (via the solder paste 500) the conductive portions on the top surface 306c of the first spacer member 306 to the first spacer member connections 212a and 212b, and the conductive portions on the top surface 308c of the first spacer member 308 to the first spacer member connections 212c and 212d. As can be seen in FIG. 5e, the solder reflow process connects the first spacer member 306 to the first spacer member 308 via the trace 210 between the first spacer member connections 208b and 208c on the ball grid array component 200, and connects the second spacer member 310 to the second spacer member 312 via the trace 214 between the second spacer member connections 212b and 212c in the ball grid array component 200. Connection of the first spacer members 306 and 308 and the second spacer members 310 and 312 completes a ball grid array monitoring circuit that is or may be coupled to the ball grid array monitoring engine 314 and includes the trace 316, the first spacer member 306, the trade 210, the first spacer member 308, the trace 320, the second spacer member 312c, the trace 214, the second spacer member 310, the trace 318, and back to the ball grid array monitoring component 314. As discussed above, the ball grid array monitoring engine 314 may not be located on the ball grid array component 200 and instead may be located in an IHS and coupled to the traces 316 and 318 on the component/board assembly subsequent to the solder reflow process (e.g., upon installation of the component/board assembly in the IHS).

Figure 6A:
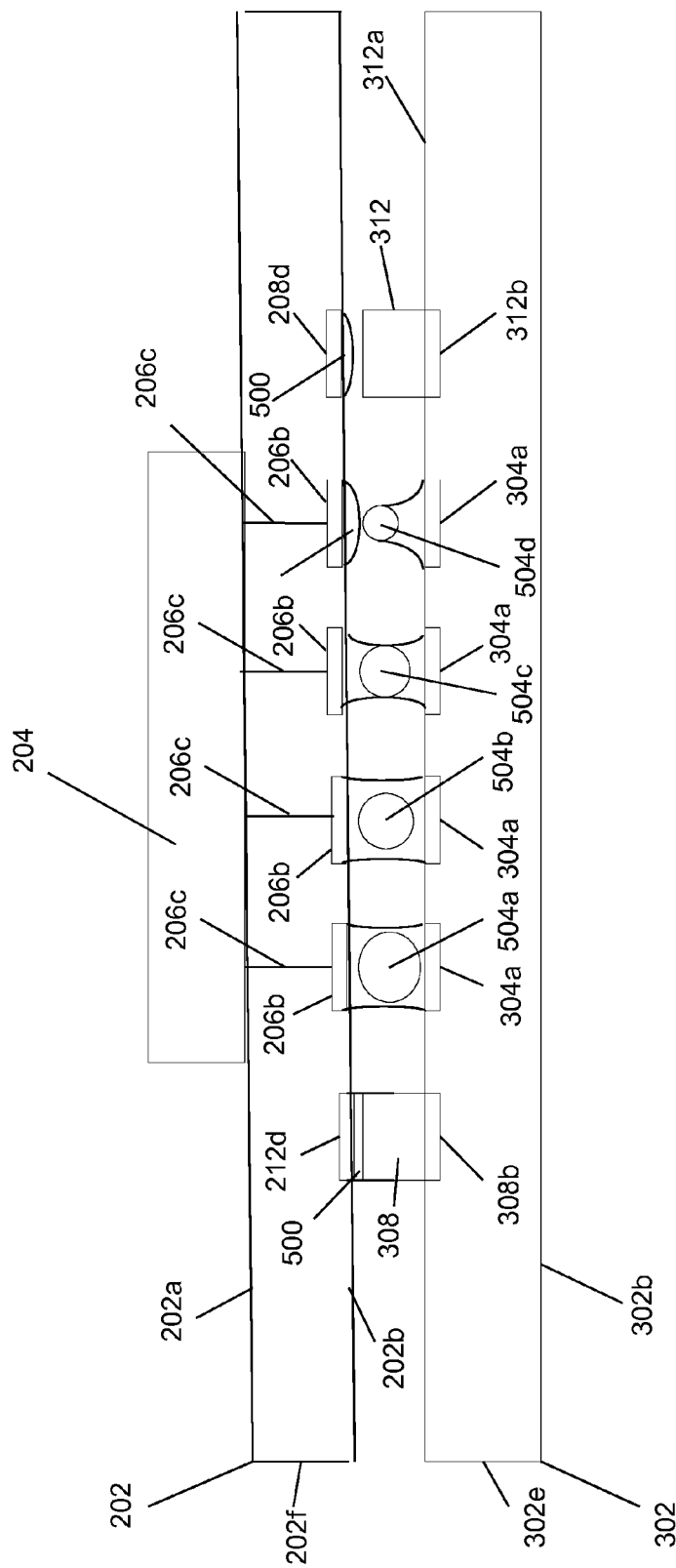
FIG. 6a is a cross sectional side view illustrating the ball grid array component of FIGS. 2a-2d to improperly soldered to the circuit board of FIGS. 3a-3d.
Figure 6B:
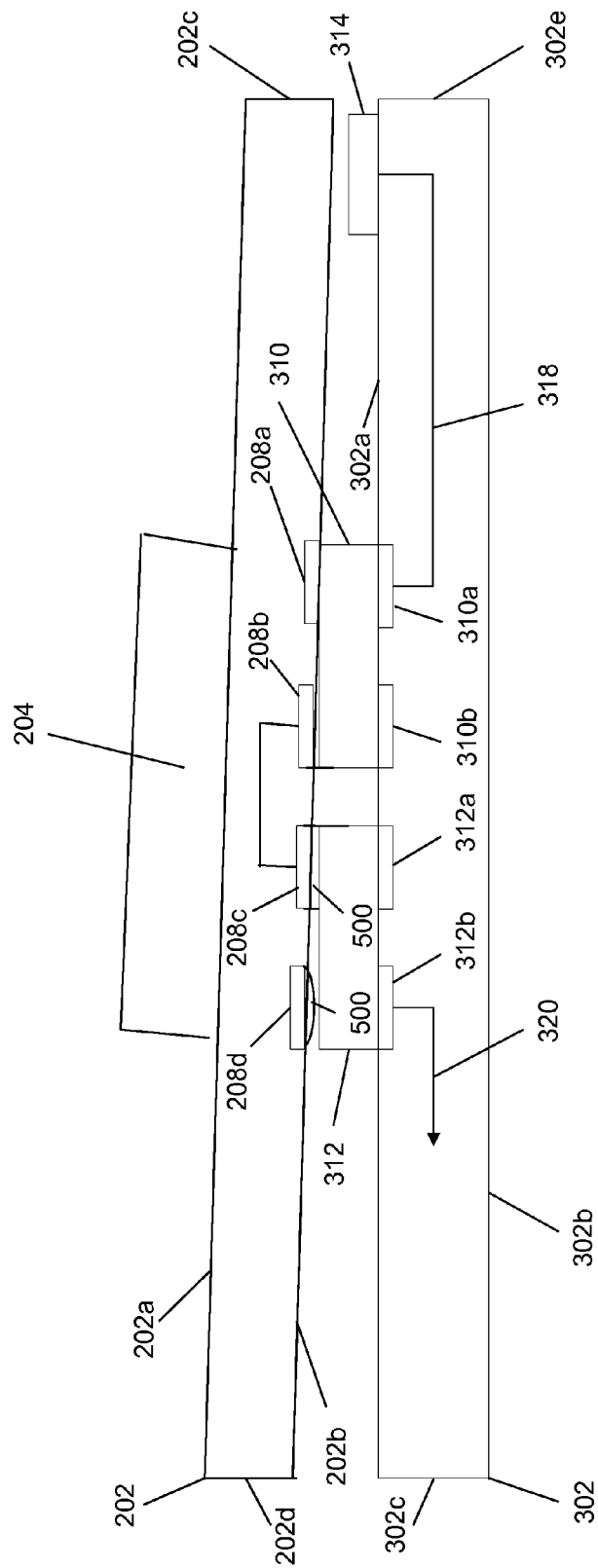
FIG. 6b is a cross sectional side view illustrating the ball grid array component of FIGS. 2a-2d to improperly soldered to the circuit board of FIGS. 3a-3d.

At block 408, the ball grid array monitoring engine 314 may operate to monitor the strength of the ball grid array monitoring circuit as a method for determining the strength of the soldered connections 502. Referring first to the embodiment of the properly soldered connections illustrated in FIGS. 5c and 5d, the monitoring of the ball grid array monitoring circuit resulting from such properly soldered connections will result in a determination of a high strength of that circuit (i.e., the connections between the spacer members and spacer member connections are strong), which is indicative of the properly soldered connections. Referring now to FIGS. 6a and 6b, an embodiment of an improperly soldered component/board assembly is illustrated that is substantially similar to the assembly discussed above with reference to FIGS. 5c and 5d, but with soldered connections 504a, 504b, 504c, and 504d. As can be seen, some problem or issue occurred during the solder reflow process such that the ball grid array component 200 is improperly soldered to the circuit board 300, with the soldered connections 504c and 504d providing less than ideal soldered connections, and the second spacer member connection 208d not engaging the second spacer member 312 via the solder paste 500. In such an embodiment, the ball grid array monitoring engine 314 may monitor the ball grid array monitoring circuit and detect that the circuit is not completed (due to the break in the ball grid array monitoring circuit), and thus determine that the strength of the ball grid array monitoring circuit is low (or in this case, broken). When the strength of the ball grid array monitoring circuit is determined to be low, that determination is indicative of less than ideal soldered connections (e.g., the soldered connections 504c and 504d), and that determination may be reported by the ball grid array monitoring engine 314 to a user subsequent to the solder reflow process (e.g., during a testing phase of the component/board assembly).

In some embodiments of block 408, the solder reflow process may complete the ball grid array monitoring circuit (e.g., as illustrated in FIGS. 5c and 5d), and the ball grid array monitoring engine 314 may monitor the ball grid array monitoring circuit to determine any degradation in the soldered connections 502. For example, when resistors are used for the spacer members, the resistance of the ball grid array monitoring circuit may be monitored for increasing resistance over time as an indicator of soldered connection failure, and an increase in resistance of 10% or more may be reported as indicative of a failure. In addition, any changes in the resistor network provided by the ball grid array monitoring circuit may be indicative of a change in the soldered connections. The use of the ball grid array monitoring circuit to determine the strength of the soldered connections is described in more detail in related and U.S. patent application Ser. No. 14/190,850, filed on Feb. 26, 2014, naming the inventors of the present disclosure and assigned to the assignee of the present disclosure, the disclosure of which is incorporated by reference. Surface mount technology (SMT) resistor packages may be selected based on their height and a desired minimum height of the soldered connections. For example, SMT resistor package 0201 provides resistors with a height of 0.25 millimeters, SMT resistor package 0402 provides resistors with a height of 0.35 millimeters, SMT resistor packages 0603/0805/1210 provide resistors with a height of 0.50 millimeters, SMT resistor packages 1206/2412 provide resistors with a height of 0.60 millimeters, SMT resistor package 2010 provides resistors with a height of 0.70 millimeters, and SMT resistor packages 1217/2020/2045 provide resistors with a height of 0.90 millimeters.

Thus, systems and methods for providing a ball grid array connection have been described that position spacer members between a ball grid array component and a circuit board to provide a mechanical stop between the ball grid array component and the circuit board during a solder reflow process and ensure a minimum height for the soldered connections between the ball grid array component and the circuit board. When conductive spacer members such as resistors are used in the systems and methods, traces may be provided in the ball grid array component and the circuit board such that the solder reflow process completes a ball grid array monitoring circuit that allows for the determination of the strength of the soldered connections. While the illustrations and discussions herein focus on the example of soldering a ball grid array component to a circuit board, one of skill in the art in possession of the present disclosure will recognize that a variety of different components and connection techniques will benefit from the spacer members and/or the monitoring circuit described herein, and thus will fall within the scope of the present disclosure. Furthermore, while the spacer members have been described as being mounted to the circuit board prior to the solder reflow process, in other embodiments the spacer members may be mounted to the ball grid array components (with the spacer member connectors then provided on the circuit board). In yet other embodiments, the spacer member connectors may not be mounted to either the ball grid array component or the circuit board, but rather may be provided between the ball grid array component and the circuit board for the solder reflow process.

Figure 7:
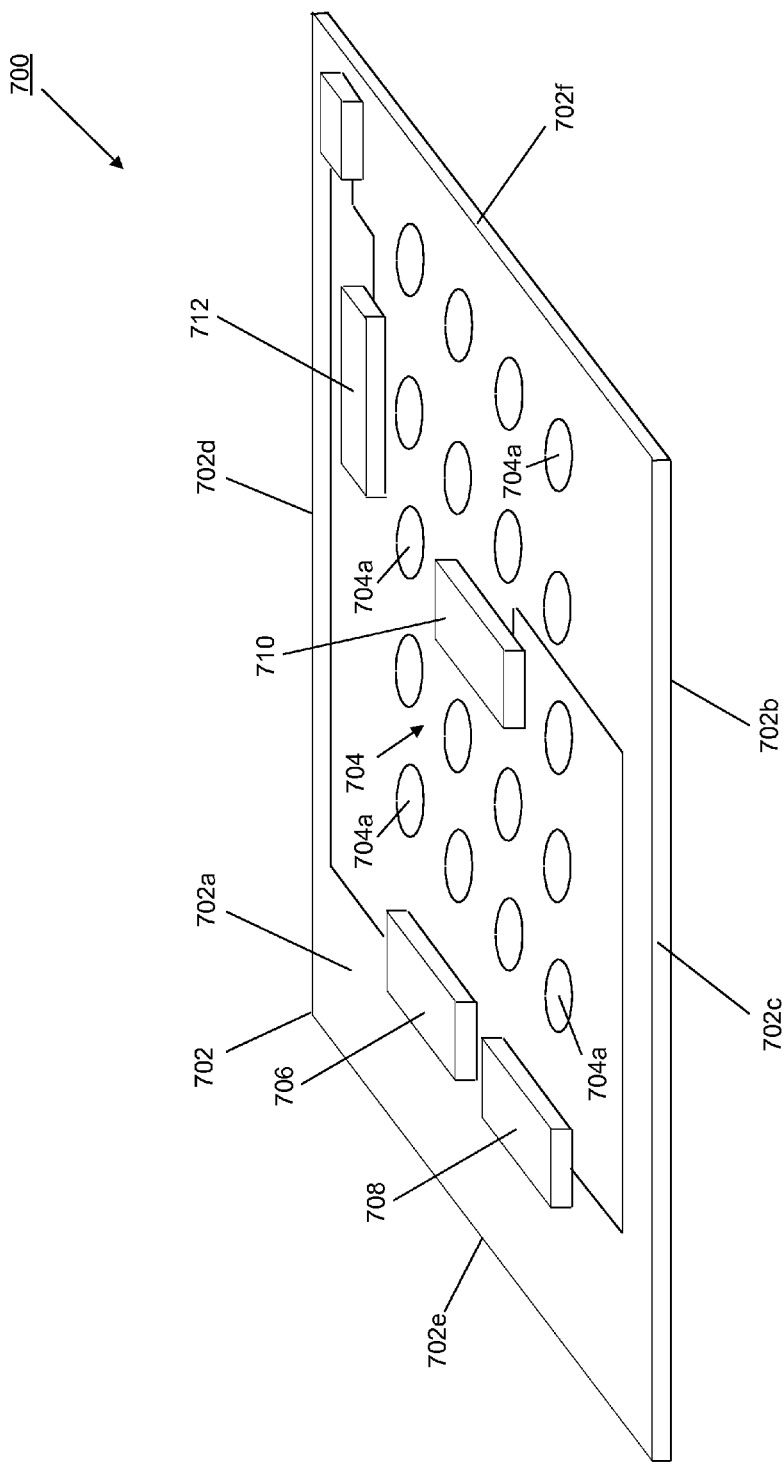
FIG. 7 is a perspective view illustrating an embodiment of a circuit board.

Referring now to FIG. 7, an embodiment of a circuit board 700 is illustrated. The circuit board 700 is provided to illustrate how the positioning of the spacer members may vary from those discussed above. The circuit board 700 includes a base 702 having a top surface 702a, a bottom surface 702b located opposite the base 702 from the top surface 702a, a front edge 702c extending between the top surface 702a and the bottom surface 702b, a rear edge 702d located opposite the base 702 from the front edge 702c and extending between the top surface 702a and the bottom surface 702b, and a pair of opposing side edges 702e and 702f that are located opposite the base 702 from each other and that each extend between the top surface 702a, the bottom surface 702b, the front edge 702c, and the rear edge 702d.

The circuit board 700 includes a pad array 704 located on the top surface 702a of the base 702. The pad array 704 includes a plurality of pads 704a that may be electrically connected through the base 702 to any variety of devices located on the base 702 or otherwise coupled to the circuit board 700. A plurality of spacer members 706, 708, 710, and 712 are provided at various locations on the top surface 702a of the base 702. For example, the spacer members 706 and 708 are located between the pad array 704 and the side edge 702e, the spacer member 712 is provided between the pad array 704 and the rear edge 702d, and the spacer member 710 is provided within the pad array 704. The circuit board 700 illustrates how the number, size, and relative positioning of the spacer members may be varied from that illustrated and described above, and may be selected based on a desired mechanical strength, available space on the circuit board 700 and ball grid array component, and/or any other criteria known in the art. For example, more spacer members may be provided at the perimeter of the pad array or solder ball array if more strength around the soldered connections is needed, or spacer members may be provided in rows/columns on a particular edge of the pad array and solder ball array if that edge experiences particularly high stresses during, for example, installation of the component/board assembly. One of skill in the art in possession of the present disclosure will recognize how a ball grid array component may be provided with a solder ball array and spacer member connectors such that the functionality discussed above with reference to the method 400 may be provided using the circuit board 700.

Figure 8:
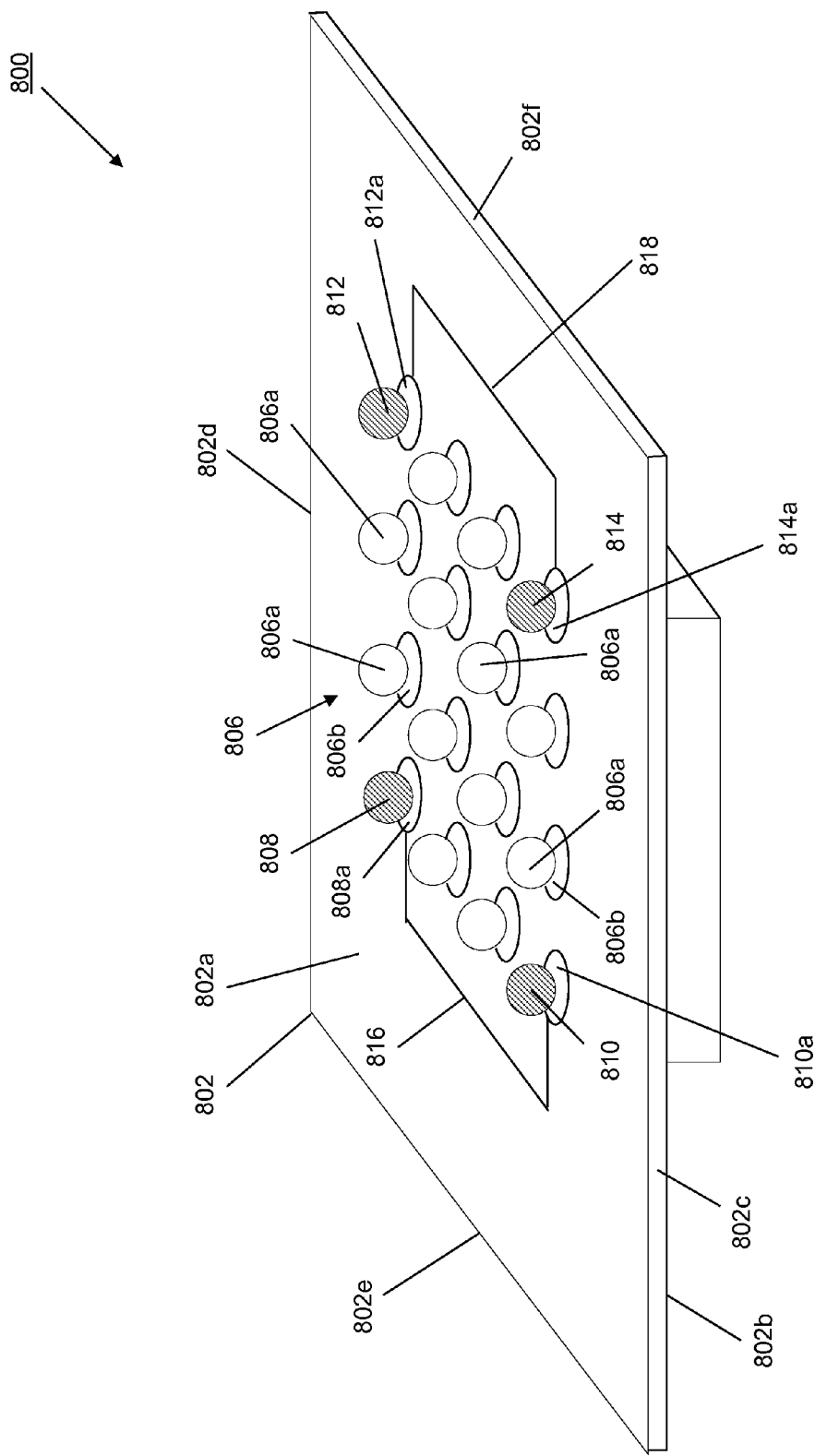
FIG. 8 is a perspective view illustrating an embodiment of a ball grid array component.
Figure 9:
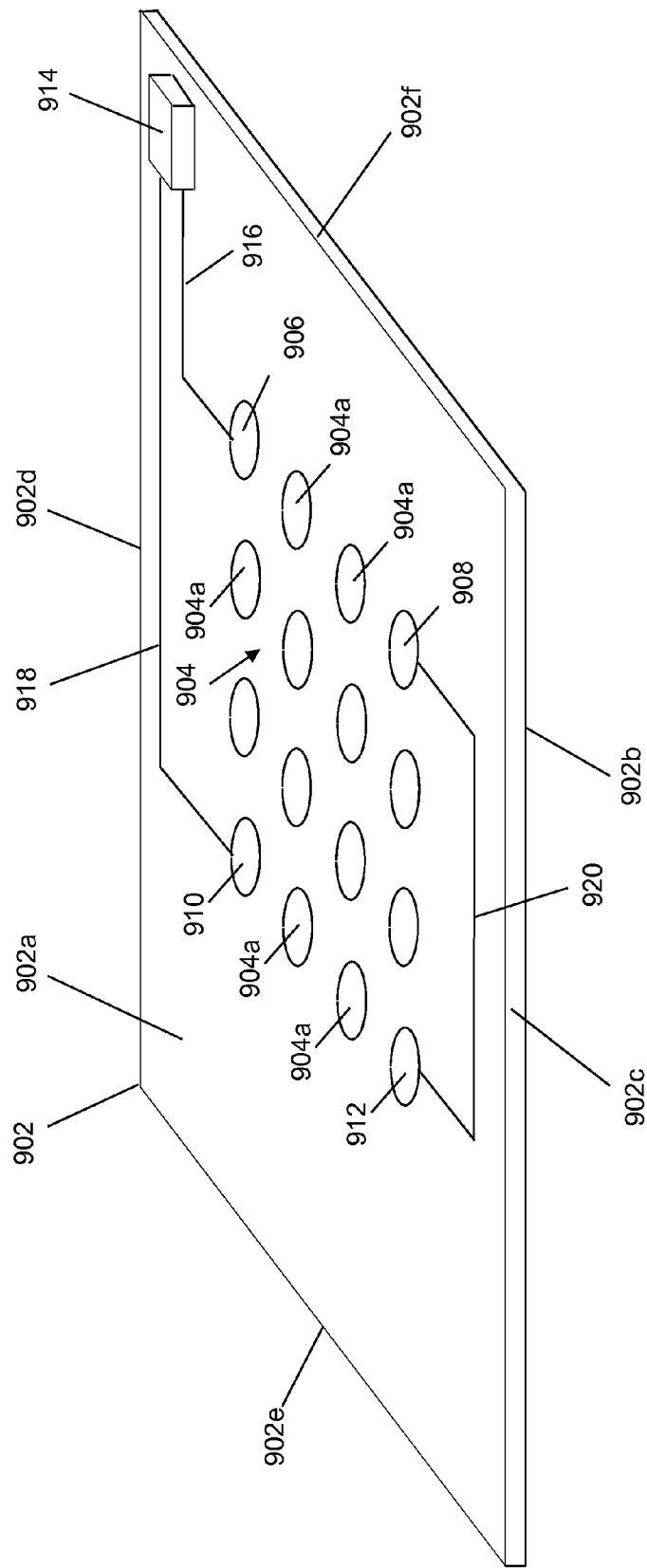
FIG. 9 is a perspective view illustrating an embodiment of a circuit board

Referring now to FIGS. 8 and 9, an alternative to the spacer members discussed above is illustrated and described. FIG. 8 illustrates an embodiment of a ball grid array component 800 that is substantially similar to the ball grid array component 200 discussed above, but with some differences detailed below. The ball grid array component 800 includes a base 802 having a top surface 802a, a bottom surface 802b located opposite the base 802 from the top surface 802a, a front edge 802c extending between the top surface 802a and the bottom surface 802b, a rear edge 802d located opposite the base 802 from the front edge 802c and extending between the top surface 802a and the bottom surface 802b, and a pair of opposing side edges 802e and 802f that are located opposite the base 802 from each other and that each extend between the top surface 802a, the bottom surface 802b, the front edge 802c, and the rear edge 802d. In the illustrated embodiment, a ball grid array device 804 is located on the top surface 802a of the base 802.

The ball grid array component 800 includes a solder ball array 806 located on the bottom surface 802b of the base 802. The solder ball array 206 includes a plurality of solder balls 806a provided on respective solder ball connections 806b that may be electrically connected through the base 802 to the ball grid array device 804 and/or other devices in or on the base 802. In addition, spacer members 808, 810, 812, and 814 are provided on the bottom surface 802b of the base 802 on spacer member connections 808a, 810a, 812a, and 814a. In an embodiment, the spacer members 808, 810, 812, and 814 are conductive polymer cored balls that are provided at what would be the corners of the solder ball array 806, but in other embodiments may be located at different positioned (e.g., within the solder ball array 806) and made of different materials (e.g., a variety of conductive (in ball grid array monitoring circuit embodiments) or non-conductive (in non-ball grid array monitoring circuit embodiments) materials with a higher melting temperature than the solder balls 806a) while remaining within the scope of the present disclosure. The conductive polymer cored balls may include a solid, flexible polymer core that is coated with a solder coating such as, for example, a Nickel/Copper material. The spacer connections 808a and 810a are connected via a trace 816, and the spacer connections 808a and 810a are connected via a trace 818.

Referring now to FIG. 9, an embodiment of a circuit board 900 is illustrated. The circuit board 900 includes a base 902 having a top surface 902a, a bottom surface 902b located opposite the base 902 from the top surface 902a, a front edge 902c extending between the top surface 902a and the bottom surface 902b, a rear edge 902d located opposite the base 902 from the front edge 902c and extending between the top surface 902a and the bottom surface 902b, and a pair of opposing side edges 902e and 902f that are located opposite the base 902 from each other and that each extend between the top surface 902a, the bottom surface 902b, the front edge 902c, and the rear edge 902d.

The circuit board 900 includes a pad array 904 located on the top surface 902a of the base 902. The pad array 904 includes a plurality of pads 904a that may be electrically connected through the base 302 to any variety of devices located on the base 902 or otherwise coupled to the circuit board 900. A plurality of spacer member connections 906, 908, 910, and 912 are provided at what would be the corners of the pad array 904, with the spacer member connector 906 coupled to a ball grid array monitoring engine 914 via a trace 916, the spacer member connector 910 coupled to the ball grid array monitoring engine 914 via a trace 918, and the spacer member connector 908 coupled to the spacer member connector 912 via a trace 920. One of skill in the art in possession of the present disclosure will recognize how the spacer members 808, 810, 812, and 814 may operate similarly to the spacer members 306, 308, 310, and 312 discussed above according to the method 400, and how a ball grid array monitoring circuit may be provided by the ball grid array component 800/circuit board 900 via the spacer members 808, 810, 812, and 814, and the traces 816, 818, 916, 918, and 920 during the method 400 for use in monitoring soldered connections provided between the solder balls 806a and the pads 904a.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An information handling system (IHS), comprising:
an IHS chassis; and
a circuit board located in the IHS chassis and having a circuit board surface, the circuit board including:
  a plurality of pads that are located on the circuit board surface; and
  a ball grid array component that is soldered to the circuit board, the ball grid array component including:
    a plurality of soldered connections between the ball grid array component and the circuit board, wherein each of the plurality of soldered connections has a first melting temperature and has been soldered to a respective one of the plurality of pads during a reflow process; and
    a plurality of conductive spacer members that each engage the circuit board and the ball grid array component to complete a ball grid array monitoring circuit that is configured to measure a strength of the plurality of soldered connections, wherein each of the plurality of conductive spacer members has a second melting temperature greater than the first melting temperature such that each of the plurality of conductive spacer members provide a mechanical stop between the ball grid array component and the circuit board during the reflow process that is performed at a temperature below the second melting temperature, and a minimum height for each of the plurality of soldered connections.

2. The IHS of claim 1, further comprising:
at least one connection in at least one of the circuit board and the ball grid array component that engages the plurality of conductive spacer members to complete the ball grid array monitoring circuit.

3. The IHS of claim 1, wherein at least one of the plurality of conductive spacer members includes a resistor.

4. The IHS of claim 2, further comprising:
a ball grid array monitoring engine coupled to the ball grid array monitoring circuit and configured to measure a strength of the ball grid array monitoring circuit to measure the strength of the plurality of soldered connections.

5. The IHS of claim 4, wherein the ball grid array monitoring engine is provided by a Basic Input/Output System (BIOS) that is provided in the IHS chassis.

6. The IHS of claim 1, wherein the plurality of conductive spacer members includes at least one first conductive spacer member and at least one second conductive spacer member, and wherein the at least one first conductive spacer member is located on a first side of a perimeter of the plurality of soldered connections, and the at least one second conductive spacer member is located on a second side of the perimeter of the plurality of soldered connections that is different than the first side.

7. The IHS of claim 1, wherein the ball grid array component includes a processor that is coupled to the plurality of soldered connections.

8. The IHS of claim 1, wherein the circuit board is a first circuit board, and wherein the ball grid array component includes a second circuit board.

\* \* \* \* \*